US011380524B2

(12) United States Patent
Perry

(10) Patent No.: US 11,380,524 B2
(45) Date of Patent: Jul. 5, 2022

(54) LOW RESISTANCE CONFINEMENT LINER FOR USE IN PLASMA CHAMBER

(71) Applicant: APPLIED MATERIALS, INC., Santa Clara, CA (US)

(72) Inventor: Joseph Perry, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 3 days.

(21) Appl. No.: 16/824,504

(22) Filed: Mar. 19, 2020

(65) Prior Publication Data

US 2021/0296095 A1    Sep. 23, 2021

(51) Int. Cl.
*H01J 37/32* (2006.01)
*H01L 21/67* (2006.01)

(52) U.S. Cl.
CPC .... *H01J 37/32495* (2013.01); *H01J 37/3244* (2013.01); *H01J 37/3255* (2013.01); *H01J 37/32467* (2013.01); *H01J 37/32642* (2013.01); *H01L 21/67069* (2013.01); *H01J 2237/334* (2013.01)

(58) Field of Classification Search
CPC ............. H01J 37/32495; H01J 37/3244; H01J 37/32467; H01J 37/3255; H01J 37/32642; H01J 2237/334; H01L 21/67069
See application file for complete search history.

(56) References Cited

U.S. PATENT DOCUMENTS

| | | | |
|---|---|---|---|
| 6,129,808 A | 10/2000 | Wicker et al. | |
| 6,156,151 A | 12/2000 | Komino et al. | |
| 6,464,843 B1 | 10/2002 | Wicker et al. | |
| 6,506,254 B1 | 1/2003 | Bosch et al. | |
| 6,506,685 B2 | 1/2003 | Li et al. | |
| 7,267,741 B2 | 9/2007 | Ren | |
| 7,552,521 B2 | 6/2009 | Fink | |
| 7,585,384 B2 | 9/2009 | Bera et al. | |

(Continued)

FOREIGN PATENT DOCUMENTS

| | | |
|---|---|---|
| CR | 106898534 A | 6/2017 |
| JP | 2011040461 A | 2/2011 |

(Continued)

OTHER PUBLICATIONS

International Search Report for PCT/US2021/021986, dated Jun. 28, 2021.

*Primary Examiner* — Yuechuan Yu
(74) *Attorney, Agent, or Firm* — Moser Taboada

(57) ABSTRACT

Embodiments of liners for use in a process chamber are provided herein. In some embodiments, a liner for use in a process chamber includes an upper liner having a top plate with a central opening and a tubular body extending downward from an outer peripheral portion of the top plate, wherein the top plate has a contoured inner surface having a first step with a first inner diameter and a second step with a second inner diameter greater than the first inner diameter, and wherein the tubular body has an opening for transferring a substrate therethrough; and a lower liner abutting a bottom surface of the tubular body, wherein the lower liner extends radially inward from the tubular body and includes a plurality of radial slots arranged around the lower liner, wherein the upper liner and the lower liner form a C-shaped cross-section.

20 Claims, 5 Drawing Sheets

(56) References Cited

U.S. PATENT DOCUMENTS

| | | | |
|---|---|---|---|
| 7,754,997 B2 | 7/2010 | Bera et al. | |
| 7,802,539 B2 | 9/2010 | Bosch | |
| 7,837,826 B2 | 11/2010 | Marakhtanov et al. | |
| 7,972,467 B2 | 7/2011 | Bera et al. | |
| 8,485,128 B2 | 7/2013 | Kellogg et al. | |
| 8,622,021 B2 | 1/2014 | Taylor et al. | |
| 8,826,855 B2 | 9/2014 | Kellogg et al. | |
| 8,893,702 B2 | 11/2014 | Stumpf et al. | |
| 8,900,398 B2 | 12/2014 | Dhindsa et al. | |
| 9,123,661 B2 | 9/2015 | Kellogg | |
| 9,184,029 B2 | 11/2015 | Dhindsa et al. | |
| 9,330,927 B2 | 5/2016 | Dhindsa et al. | |
| 9,508,530 B2 | 11/2016 | Dhindsa et al. | |
| 9,779,916 B2 | 10/2017 | Dhindsa et al. | |
| 2003/0092278 A1 | 5/2003 | Fink | |
| 2005/0224179 A1* | 10/2005 | Moon | H01J 37/32834 156/345.29 |
| 2007/0181257 A1* | 8/2007 | Comendant | H01J 37/321 156/345.48 |
| 2008/0023029 A1 | 1/2008 | Ren | |
| 2008/0110567 A1 | 5/2008 | Miller et al. | |
| 2009/0188625 A1 | 7/2009 | Carducci et al. | |
| 2010/0304571 A1 | 12/2010 | Larson et al. | |
| 2011/0100553 A1 | 5/2011 | Dhindsa et al. | |
| 2011/0226739 A1* | 9/2011 | Allen | H01J 37/3244 216/67 |
| 2012/0273130 A1 | 11/2012 | Drewery et al. | |
| 2014/0013453 A1 | 1/2014 | Futa et al. | |
| 2014/0116338 A1 | 5/2014 | He et al. | |
| 2015/0329955 A1 | 11/2015 | Sun et al. | |
| 2015/0364322 A1 | 12/2015 | Kellogg | |
| 2018/0061618 A1* | 3/2018 | Nichols | H01J 37/321 |
| 2019/0062947 A1* | 2/2019 | Savas | H01L 21/68707 |

FOREIGN PATENT DOCUMENTS

| | | |
|---|---|---|
| KR | 201803064 U | 10/2018 |
| KR | 2040281 B1 | 11/2019 |
| WO | WO 2004/059716 A1 | 7/2004 |

* cited by examiner

LOW RESISTANCE CONFINEMENT LINER FOR USE IN PLASMA CHAMBER

FIELD

Embodiments of the present disclosure generally relate to substrate processing equipment.

BACKGROUND

Plasma processing of semiconductor wafers in the manufacture of microelectronic integrated circuits is used, for example, in dielectric etching, metal etching, chemical vapor deposition, and other processes. In semiconductor substrate processing, the trend towards increasingly smaller feature sizes and line-widths has placed a premium on the ability to mask, etch, and deposit material on a semiconductor substrate with greater precision.

Typically, etching is accomplished by applying radio frequency (RF) power to a working gas supplied to a low pressure processing region over a substrate supported by a support member. The resulting electric field creates a reaction zone in the processing region that excites the working gas into a plasma. The support member is biased to attract ions within the plasma towards the substrate supported thereon. Ions migrate towards a boundary layer of the plasma adjacent to the substrate and accelerate upon leaving the boundary layer. The accelerated ions produce the energy required to remove, or etch, the material from the surface of the substrate. As the accelerated ions can etch other components within the processing chamber, it is important that the plasma be confined to the processing region above the substrate.

Unconfined plasmas cause etch-byproduct deposition on the chamber walls and could also etch the chamber walls. Etch-byproduct deposition on the chamber walls could cause the process to drift. The etched materials from the chamber walls could contaminate the substrate by re-deposition and/or could create particles for the chamber. In addition, unconfined plasmas could also cause etch-byproduct deposition in the downstream areas. The accumulated etch-byproduct can flake off and result in particles. To reduce the particle issues caused by the deposition of etch-byproduct in the downstream areas, additional downstream clean is needed, which could reduce process throughput and increase processing cost.

Accordingly, the inventors have provided improved confinement liners herein.

SUMMARY

Embodiments of liners for use in a process chamber are provided herein. In some embodiments, a liner for use in a process chamber includes: an upper liner having a top plate with a central opening and a tubular body extending downward from an outer peripheral portion of the top plate, wherein the top plate has a contoured inner surface having a first step with a first inner diameter and a second step with a second inner diameter greater than the first inner diameter, and wherein the tubular body has an opening for transferring a substrate therethrough; and a lower liner abutting a bottom surface of the tubular body, wherein the lower liner extends radially inward from the tubular body and includes a plurality of radial slots arranged around the lower liner, wherein the upper liner and the lower liner form a C-shaped cross-section.

In some embodiments, a process kit for use in a process chamber includes: a liner having a top plate with a central opening, a tubular body extending downward from an outer peripheral portion of the top plate, and a lower liner extending radially inward from the tubular body to form a C-shaped cross-sectional shape of the liner, wherein the lower liner and includes a plurality of radial slots therethrough, and wherein the tubular body has an opening to facilitate transferring of a substrate therethrough; and a lower tray having an outer sidewall, an inner sidewall, and a lower wall extending from the outer sidewall to the inner sidewall, wherein the liner rests on the lower tray.

In some embodiments, a process chamber includes: a chamber body defining an interior volume therein; a showerhead disposed in the interior volume and coupled to a lid of the chamber body; a substrate support disposed in the interior volume opposite the showerhead; a liner having a top plate with a central opening, a tubular body extending downward from an outer peripheral portion of the top plate, and a lower liner that surrounds the substrate support and extends radially inward from the tubular body, wherein the top plate includes a contoured inner surface, wherein the lower liner includes a plurality of radial slots therethrough, and wherein the tubular body has an opening to facilitate transferring of a substrate therethrough.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
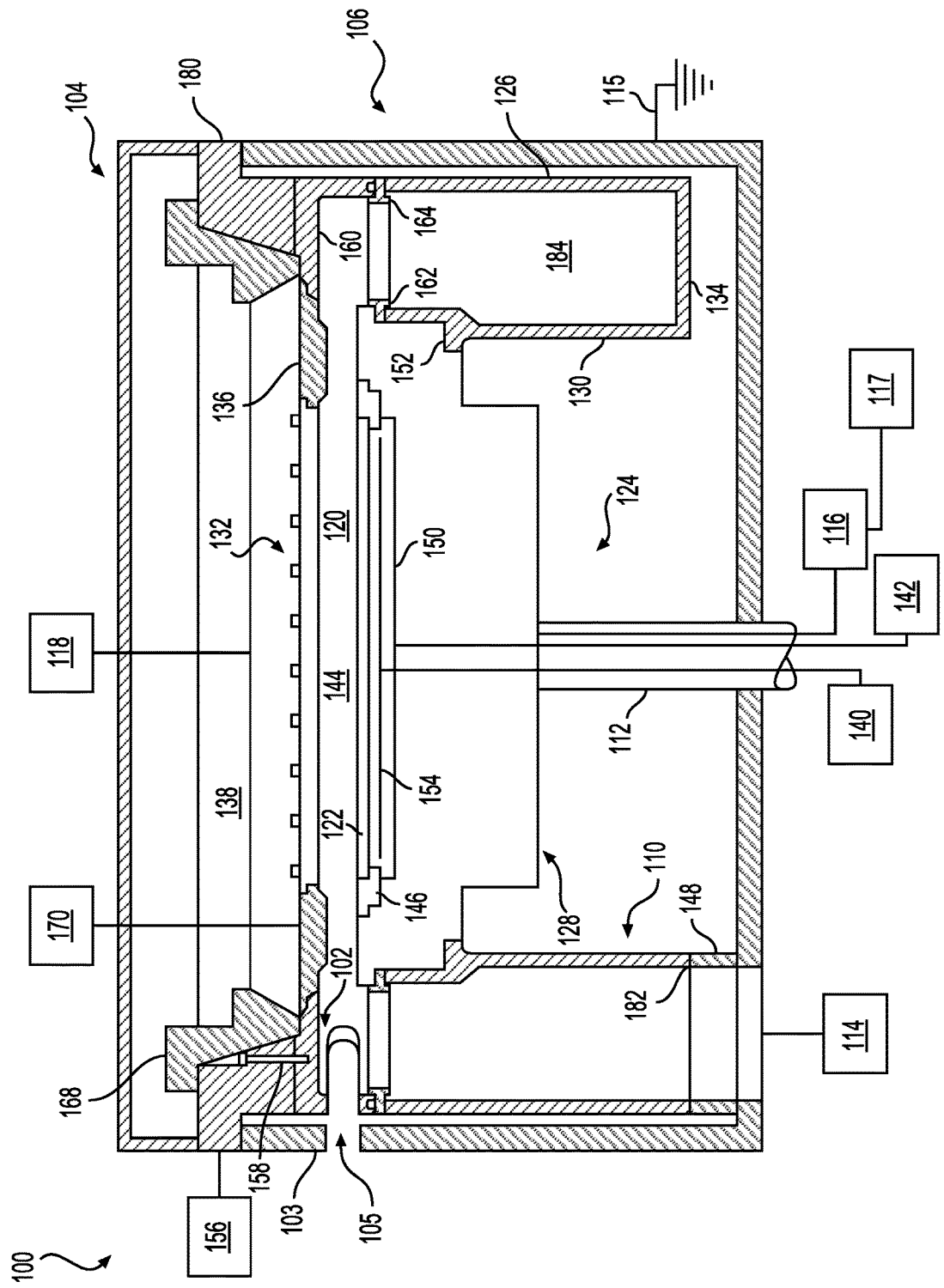
FIG. 1 is a schematic side view of a process chamber having a liner in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of liners for use in a process chamber are provided herein. The embodiments of liners, or confinement liners, provided herein advantageously confine a plasma therein while providing enhanced flow conductance therethrough. In some embodiments, the liner may be made from a material that is electrically conductive to provide a ground path for a RF power supply when the plasma is in contact with the liner. For example, in some embodiments, the liner is made of a material having an electrical resistivity less than or equal to 0.01 ohms-cm. In some embodiments, the liner may be made of a material that reduces or prevents contamination of a substrate being processed. In some embodiments, the liner is made of a silicon material, for example, silicon carbide (SiC) or polysilicon. In some embodiments, the liner is coated with a polysilicon material. The use of silicon material for the liner advantageously reduces contamination of the substrate that is being processed.

FIG. 1 is a schematic side view of a portion of a process chamber having a liner in accordance with some embodiments of the present disclosure. In some embodiments, the process chamber is an etch processing chamber. However, other types of processing chambers configured for different processes can also use or be modified for use with embodiments of the liners described herein.

The process chamber 100 is a vacuum chamber which is suitably adapted to maintain sub-atmospheric pressures within an interior volume 120 during substrate processing. The process chamber 100 includes a chamber body 106 having sidewalls and a bottom wall. The chamber body 106 is covered by a lid 104 and the chamber body 106 and the lid 104, together, define the interior volume 120. The chamber body 106 and lid 104 may be made of metal, such as aluminum. The chamber body 106 may be grounded via a coupling to ground 115.

A substrate support 124 is disposed within the interior volume 120 to support and retain a substrate 122, such as a semiconductor wafer, for example, or other such substrate as may be electrostatically retained. The substrate support 124 may generally comprise a pedestal 128 and a hollow support shaft 112 for supporting the pedestal 128. The pedestal 128 may include an electrostatic chuck 150. The electrostatic chuck 150 comprises a dielectric plate having one or more electrodes 154 disposed therein. The hollow support shaft 112 provides a conduit to provide, for example, backside gases, process gases, fluids, coolants, power, or the like, to the pedestal 128.

The substrate support 124 is coupled to a chucking power supply 140 and RF sources (e.g., RF bias power supply 117 or RF plasma power supply 170) to the electrostatic chuck 150. In some embodiments, a backside gas supply 142 is disposed outside of the chamber body 106 and supplies heat transfer gas to the electrostatic chuck 150. In some embodiments, the RF bias power supply 117 is coupled to the electrostatic chuck 150 via one or more RF match networks 116. In some embodiments, the substrate support 124 may alternatively include AC or DC bias power.

The process chamber 100 is also coupled to and in fluid communication with a process gas supply 118 which may supply one or more process gases to the process chamber 100 for processing the substrate 122 disposed therein. In some embodiments, a showerhead 132 is disposed in the interior volume 120 opposite the substrate support 124. In some embodiments, the showerhead 132 is coupled to the lid 104. The showerhead 132 and the substrate support 124 partially define a processing volume 144 therebetween. The showerhead 132 includes a plurality of openings to distribute the one or more process gases from the process gas supply 118 into the processing volume 144. The showerhead 132 may be coupled to a temperature control unit 138 to control a temperature of the showerhead 132. In some embodiments, an upper electrode 136 is disposed in the interior volume 120 opposite the substrate support 124 to further define the process volume 144. The upper electrode 136 is coupled to one or more power sources (e.g., RF plasma power supply 170) to ignite the one or more process gases. In some embodiments, the upper electrode 136 comprises silicon.

A liner 102 is disposed in the interior volume 120 about at least one of the substrate support 124 and the showerhead 132 to confine a plasma therein. In some embodiments, the liner 102 is made of a suitable process material, such as aluminum or a silicon-containing material. For example, the liner 102 may be made of silicon carbide (SiC), polysilicon, or a material coated with silicon carbide (SiC) or polysilicon to advantageously reduce contamination on the substrate 122. The liner 102 includes an upper liner 160 and a lower liner 162. The upper liner 160 may be made of any of the materials mentioned above. In some embodiments, the lower liner 162 is made of the same material as the upper liner 160. For example, the upper liner 160 and the lower liner 162 may both be made of polysilicon. In some embodiments, the upper liner 160 is made of a material different than the lower liner 162. For example, in some embodiments, the upper liner 160 is made of aluminum and the lower liner 162 is made of polysilicon or a material coated with polysilicon. In some embodiments, the upper liner 160 is made of silicon carbide (SiC) and the lower liner 162 is made of polysilicon or a material coated with polysilicon. In some embodiments, the upper liner 160 rests on the lower liner 162. In some embodiments, the upper liner 160 and the lower liner 162 are integrally formed. The lower liner 162 extends radially inward from the upper liner 160 to define a C-shaped cross-sectional shape of the liner 102. In some embodiments, an inner diameter of the upper liner 160 is greater than an inner diameter of the lower liner 162.

The lower liner 162 includes a plurality of radial slots 164 arranged around the lower liner 162 to provide a flow path of the process gases to a pump port 148 (discussed below). In some embodiments, the liner 102, along with the showerhead 132 and the pedestal 128, at least partially define the processing volume 144. In some embodiments, an outer diameter of the showerhead 132 is less than an outer diameter of the liner 102 and greater than an inner diameter of the liner 102. The liner 102 includes an opening 105 corresponding with a slit 103 in the chamber body 106 for transferring the substrate 122 into and out of the process chamber 100.

In some embodiments, the liner 102 is coupled to a heater ring 180 to heat the liner 102 to a predetermined temperature. In some embodiments, the liner 102 is coupled to the heater ring 180 via one or more fasteners 158. A heater power source 156 is coupled to one or more heating elements in the heater ring 180 to heat the heater ring 180 and the liner 102. In some embodiments, a ceramic ring 168 is disposed between the heater ring 180 and the showerhead 132 to thermally de-couple the heater ring 180 from the showerhead 132.

The process chamber 100 is coupled to and in fluid communication with a vacuum system 114, which includes a throttle valve and a vacuum pump, used to exhaust the process chamber 100. The pressure inside the process chamber 100 may be regulated by adjusting the throttle valve and/or vacuum pump. The vacuum system 114 may be coupled to a pump port 148.

In some embodiments, the liner 102 rests on a lower tray 110. The lower tray 110 is configured to direct a flow of the one or more process gases and processing by-products from the plurality of radial slots 164 to the pump port 148. In some embodiments, the lower tray 110 includes an outer sidewall 126, an inner sidewall 130, and a lower wall 134 extending from the outer sidewall 126 to the inner sidewall 130. The outer sidewall 126, the inner sidewall 130, and the lower wall 134 define an exhaust volume 184 therebetween. In some embodiments, the outer sidewall 126 and the inner sidewall 130 are annular. The lower wall 134 includes one or more openings 182 (one shown in FIG. 1) to fluidly couple the exhaust volume 184 to the vacuum system 114. The lower tray 110 may rest on or be otherwise coupled to the pump port 148. In some embodiments, the lower tray 110 includes a ledge 152 extending radially inward from the inner sidewall 130 to accommodate a chamber component, for example, the pedestal 128 of the substrate support 124. In some embodiments, the lower tray 110 is made of a conductive material such as aluminum to provide a ground path.

In operation, for example, a plasma may be created in the processing volume 144 to perform one or more processes. The plasma may be created by coupling power from a plasma power source (e.g., RF plasma power supply 170) to a process gas via one or more electrodes (e.g., upper electrode 136) near or within the interior volume 120 to ignite the process gas and create the plasma. A bias power may also be provided from a bias power supply (e.g., RF bias power supply 117) to the one or more electrodes 154 within the electrostatic chuck 150 to attract ions from the plasma towards the substrate 122.

A plasma sheath can bend at an edge of the substrate 122 causing ions to accelerate perpendicularly to the plasma sheath. The ions can be focused or deflected at the substrate edge by the bend in the plasma sheath. In some embodiments, the substrate support 124 includes an edge ring 146 disposed about the electrostatic chuck 150. In some embodiments, the edge ring 146 and the electrostatic chuck 150 define a substrate receiving surface. The edge ring 146 may be coupled to a power source, such as RF bias power supply 117 or a second RF bias power supply (not shown) to control and/or reduce the bend of the plasma sheath.

Figure 2:
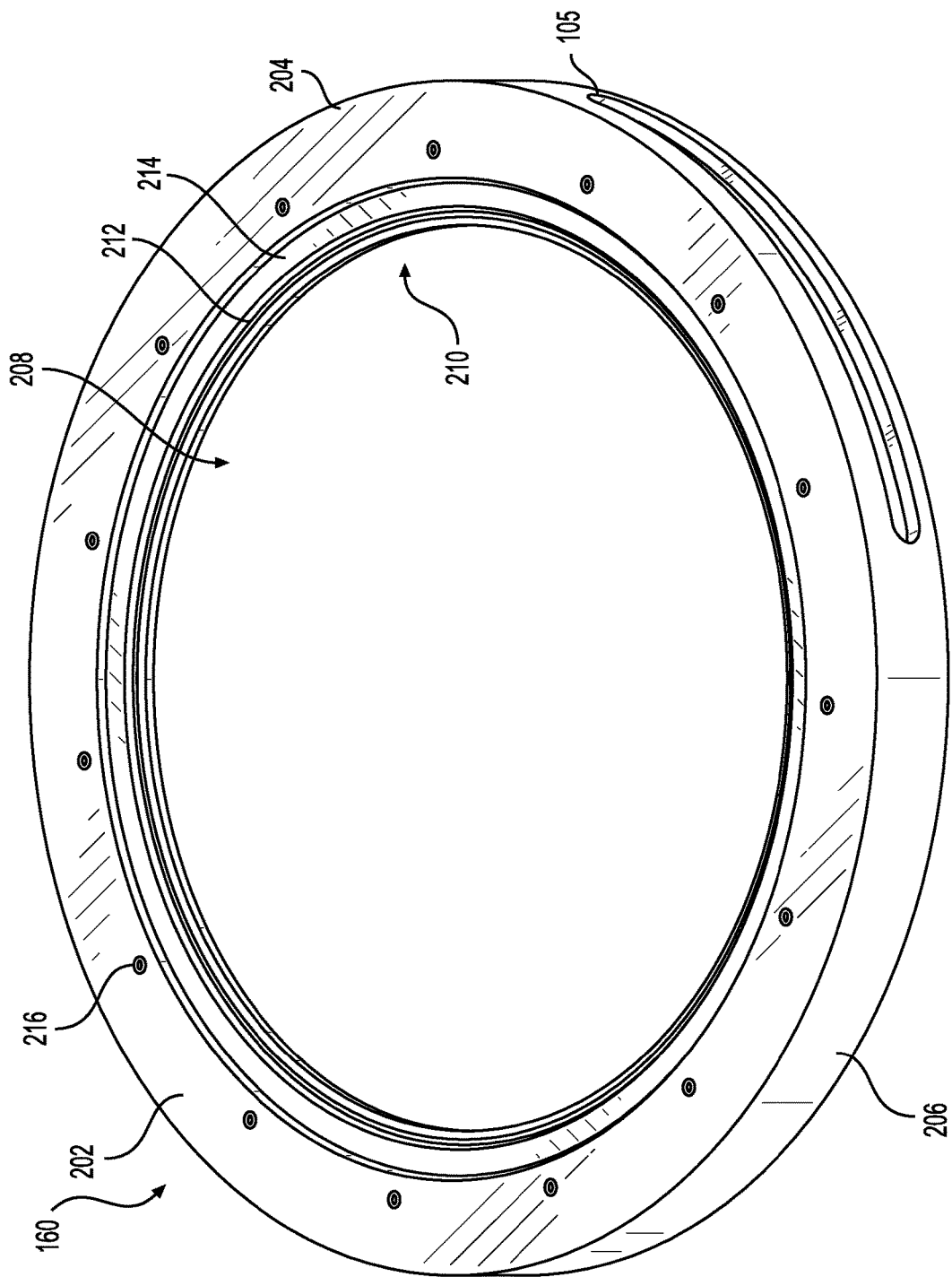
FIG. 2 is an isometric top view of a portion of a liner in accordance with some embodiments of the present disclosure.

FIG. 2 is an isometric top view of a portion of a liner suitable for use as the upper liner 160 in accordance with some embodiments of the present disclosure. The upper liner 160 includes a top plate 204 with a central opening 208. The upper liner 160 includes a tubular body 206 extending downward from a peripheral portion of the top plate 204 to define an L-shaped cross-sectional shape. In some embodiments, an upper surface 202 of the top plate 204 includes a plurality of openings 216 to facilitate coupling the liner 102 to the heater ring 180. In some embodiments, the plurality of openings 216 retain the fasteners 158.

In some embodiments, the top plate 204 has a contoured inner surface 210. In some embodiments, the contoured inner surface 210 includes a first step 212 having a first inner diameter. The first step 212 is configured to accommodate a first chamber component, for example the upper electrode 136 or the showerhead 132. In some embodiments, the contoured inner surface 210 additionally includes a second step 214 having a second inner diameter greater than the first inner diameter. The second step 214 is configured to accommodate a second chamber component. For example, the ceramic ring 168 may rest on the second step 214. In some embodiments, the first chamber component and the second chamber component may be the same component, for example the upper electrode 136 of the showerhead 132.

Figure 3:
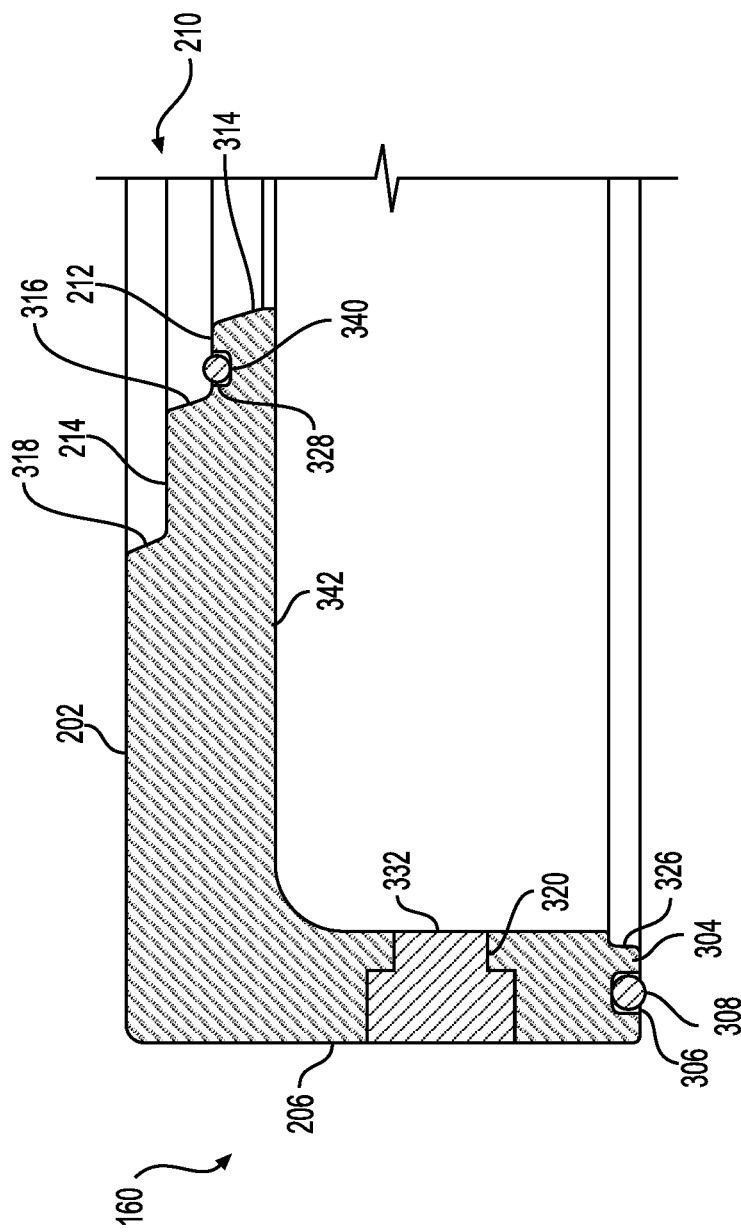
FIG. 3 is a partial cross-sectional view of a portion of a liner in accordance with some embodiments of the present disclosure.

FIG. 3 is a partial cross-sectional view of a portion of the upper liner 160 in accordance with some embodiments of the present disclosure. In some embodiments, a bottom surface 304 of the tubular body 206 includes an o-ring groove 306. The o-ring groove 306 may house an o-ring 308 to provide a seal between the upper liner 160 and the lower liner 162. In some embodiments, the tubular body 206 includes a notched lower inner edge 326 to accommodate the lower liner 162 therein. In some embodiments, the tubular body 206 may include a window 320 extending from an inner surface to an outer surface of the tubular body 206. The window 320 may be filled with a plug 332 to seal the window 320. The plug 332 is made of a material that allows for viewing into the process chamber 100 and collecting process data. In some embodiments, the plug 332 is made of aluminum oxide ($Al_2O_3$).

In some embodiments, the first step 212 includes an o-ring groove 328 to house an o-ring 340 to provide a seal between the upper liner 160 and the chamber component resting on the first step 212. In some embodiments, the contoured inner surface 210 includes a first sidewall 314 extending from a bottom surface 342 of the top plate 204 to the first step 212. In some embodiments, the first sidewall 314 extends upward and radially outward. In some embodiments, the contoured inner surface 210 includes a second sidewall 316 extending from the first step 212 to the second step 214. In some embodiments, the second sidewall 316 extends upward and radially outward. In some embodiments, the contoured inner surface 210 includes a third sidewall 318 extending from the second step 214 to the upper surface 202 of the top plate 204. In some embodiments, the third sidewall 318 extends upward and radially outward. In some embodiments, an inner diameter of the top plate 204 is about 9.0 inches to about 10.0 inches. In some embodiments, the liner 102 has a height of about 2.0 inches to about 3.0 inches.

Figure 4:
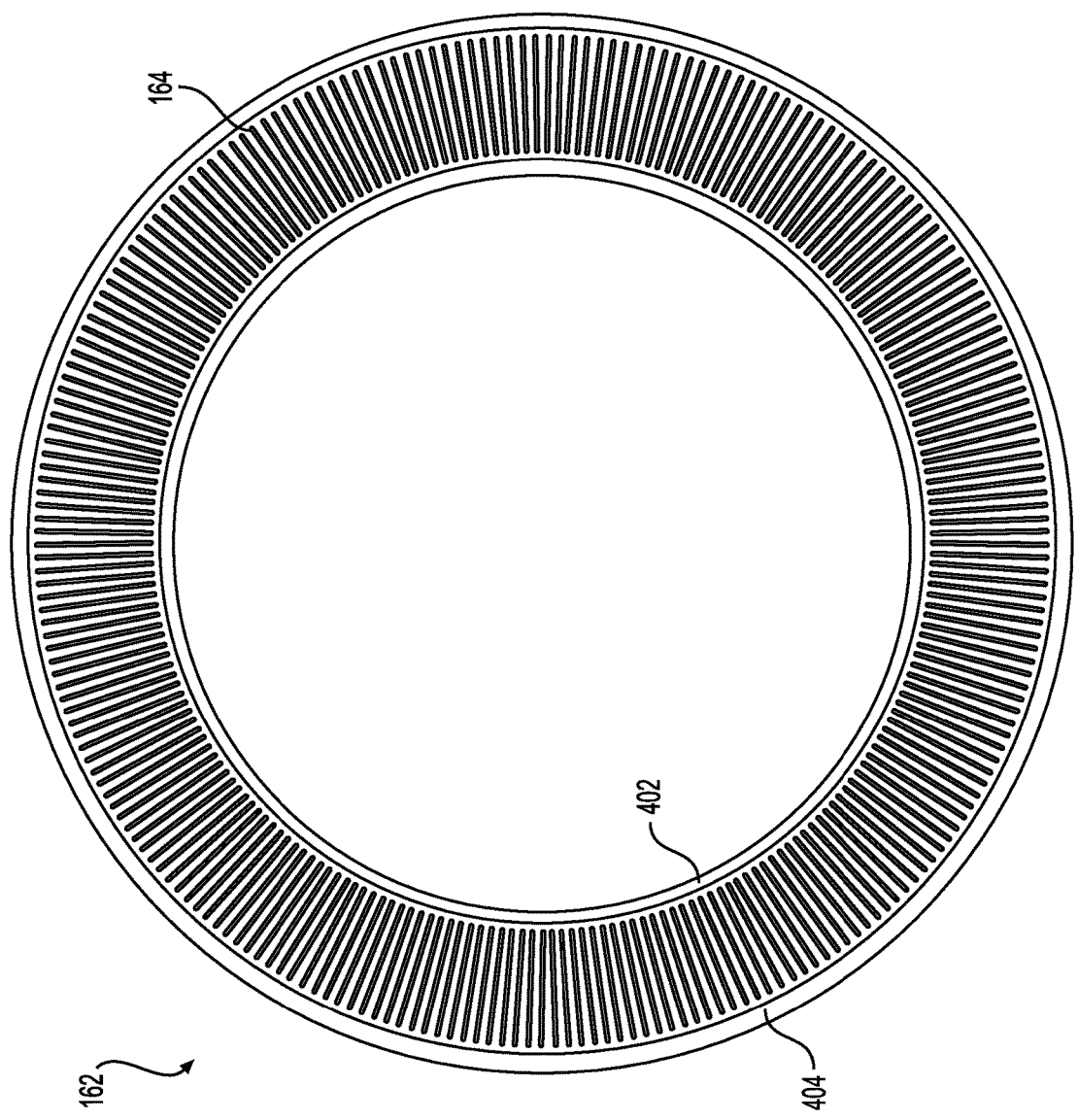
FIG. 4 is a top view of a portion of a liner in accordance with some embodiments of the present disclosure.

FIG. 4 is a top view of a portion of the liner 102 in accordance with some embodiments of the present disclosure. The plurality of radial slots 164 of the lower liner 162 are configured to direct a flow from the processing volume 144 to the pump port 148. The plurality of radial slots 164 are suitably sized to reduce or prevent plasma from escaping the processing volume 144. In some embodiments, the plurality of radial slots 164 are arranged at regular intervals. In some embodiments, the plurality of radial slots 164 include about 200 to about 300 slots. In some embodiments, a width of each of the plurality of radial slots 164 is about 0.02 inches to about 0.2 inches. In some embodiments, a width of each of the plurality of radial slots 164 is about 0.02 inches to about 0.08 inches. In some embodiments, a total open area defined by the plurality of radial slots 164 is about 30 percent to about 50 percent of a total top surface area of the lower liner 162. In some embodiments, the lower liner 162 includes an upper inner notch 402 to support the pedestal 128. In some embodiments, the lower liner 162 includes an upper outer notch 404 to support the upper liner 160.

Figure 5:
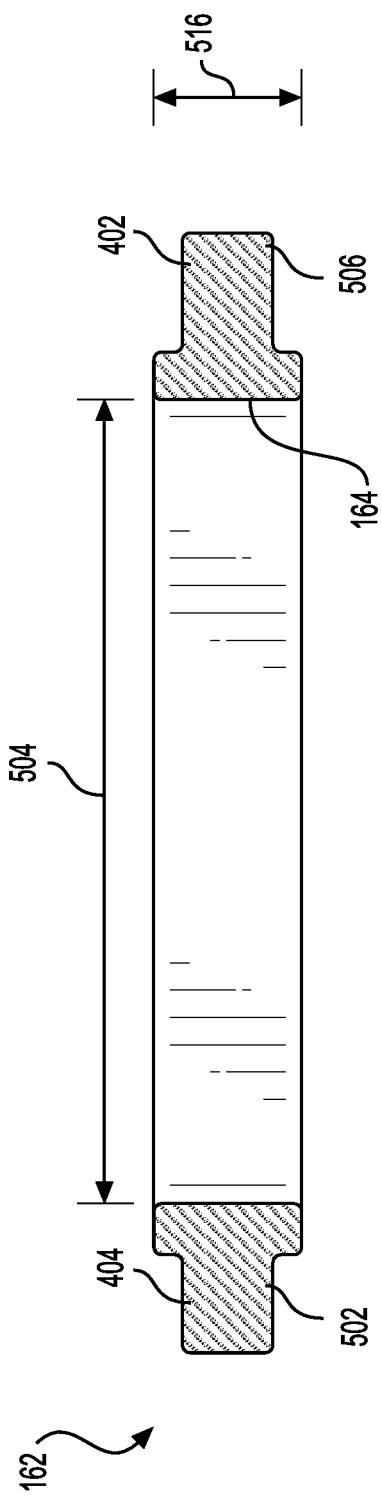
FIG. 5 is a partial cross-sectional view of a portion of a liner in accordance with some embodiments of the present disclosure.

FIG. 5 is a partial cross-sectional view of a portion of the liner 102 in accordance with some embodiments of the present disclosure. In some embodiments, the upper liner 160 rests on an upper surface of the upper outer notch 404. In some embodiments, the o-ring 308 rests on the upper surface of the upper outer notch 404 to form a seal between the lower liner 162 and the upper liner 160. In some embodiments, the lower liner 162 includes a lower outer notch 502 to accommodate the outer sidewall 126 of the lower tray 110. In some embodiments, the lower liner 162 includes a lower inner notch 506 to accommodate the inner sidewall 130 of the lower tray 110. In some embodiments, an outer diameter of the lower liner 162 is about equal to an outer diameter of the lower tray 110. In some embodiments, the plurality of radial slots have a length 504 of about 4.5 inches to about 5.5 inches. In some embodiments, the lower liner 162 has a height 516 of about 0.25 inches to about 0.75 inches.

While the foregoing is directed to embodiments of the present disclosure, other and further embodiments of the disclosure may be devised without departing from the basic scope thereof.

We claim:

1. A liner for use in a process chamber, comprising:
   an upper liner having a top plate with a central opening and a tubular body extending downward from an outer peripheral portion of the top plate, wherein the top plate has a thickness and a contoured inner surface having a first step that reduces the thickness and a second step that further reduces the thickness, and wherein the tubular body has an opening for transferring a substrate therethrough; and
   a lower liner abutting a bottom surface of the tubular body, wherein the lower liner extends radially inward from the tubular body and includes a plurality of radial slots arranged around the lower liner, wherein the upper liner and the lower liner form a C-shaped cross-section.

2. The liner of claim 1, wherein the upper liner and the lower liner are made of polysilicon or coated with a polysilicon material.

3. The liner of claim 1, wherein a total open area defined by the plurality of radial slots of the lower liner is about 30 percent to about 50 percent of a total top surface area of the lower liner.

4. The liner of claim 1, wherein the plurality of radial slots are arranged at regular intervals.

5. The liner of claim 1, wherein an inner diameter of the upper liner is greater than an inner diameter of the lower liner.

6. The liner of claim 1, wherein the tubular body extends into an upper outer notch of the lower liner.

7. The liner of claim 1, wherein the bottom surface of the tubular body includes an o-ring groove.

8. The liner of claim 1, wherein the contoured inner surface includes a first sidewall, a second sidewall having a diameter greater than the first sidewall, and a third sidewall having a diameter greater than the second sidewall.

9. The liner of claim 1, wherein the plurality of radial slots have a length of about 4.5 inches to about 5.5 inches.

10. The liner of claim 1, wherein an outer diameter of the tubular body is substantially constant from a lower surface of the tubular body to an upper surface of the tubular body.

11. The liner of claim 1, wherein the contoured inner surface includes a first sidewall extending upward and radially inward from a bottom surface of the top plate to the first step.

12. The liner of claim 11, wherein the contoured inner surface includes a second sidewall extending from the first step to the second step.

13. The liner of claim 1, wherein the lower liner is reversible.

14. A process kit for use in a process chamber, comprising: the liner of claim 1; and a lower tray having an outer sidewall, an inner sidewall, and a lower wall extending from the outer sidewall to the inner sidewall, wherein the lower liner rests on the outer sidewall of the lower tray at a lower outer notch.

15. The process kit of claim 14, wherein the lower liner includes a lower inner notch, and the lower liner rests on the inner sidewall at the lower inner notch.

16. A process chamber, comprising: a chamber body defining an interior volume therein; a showerhead disposed in the interior volume and coupled to a lid of the chamber body; a substrate support disposed in the interior volume opposite the showerhead; and the liner according to claim 1 disposed around the substrate support.

17. The process chamber of claim 16, wherein the substrate support includes an edge ring coupled to a power source.

18. The process chamber of claim 16, further comprising an upper electrode made of silicon disposed on the contoured inner surface.

19. The process chamber of claim 16, further comprising a heater ring disposed on the top plate and configured to heat the liner.

20. The process chamber of claim 16, wherein the liner is made of silicon carbide (SiC) or polysilicon or is coated with silicon carbide (SiC) or polysilicon.

* * * * *